(12) United States Patent
Rosenstein et al.

(10) Patent No.: US 8,200,600 B2
(45) Date of Patent: Jun. 12, 2012

(54) ELECTRONIC SYSTEM CONDITION MONITORING AND PROGNOSTICS

(75) Inventors: Michael Todd Rosenstein, South Hadley, MA (US); Bryan Paul Adams, Jamaica Plain, MA (US); Nicholas George Dilip Roy, Jamaica Plain, MA (US)

(73) Assignee: Irobot Corporation, Bedford, MA (US)

( * ) Notice: Subject to any disclaimer, the term of this patent is extended or adjusted under 35 U.S.C. 154(b) by 877 days.

(21) Appl. No.: 12/052,726

(22) Filed: Mar. 20, 2008

(65) Prior Publication Data

US 2008/0235172 A1 Sep. 25, 2008

Related U.S. Application Data

(60) Provisional application No. 60/895,752, filed on Mar. 20, 2007, provisional application No. 61/022,785, filed on Jan. 22, 2008.

(51) Int. Cl.
*G06F 17/00* (2006.01)
*G06N 5/02* (2006.01)
(52) U.S. Cl. ....................................................... 706/46
(58) Field of Classification Search ..................... 706/46
See application file for complete search history.

(56) References Cited

U.S. PATENT DOCUMENTS

| | | | |
|---|---|---|---|
| 2005/0151513 A1* | 7/2005 | Cook et al. | 320/137 |
| 2007/0273504 A1* | 11/2007 | Tran | 340/539.12 |
| 2009/0325044 A1* | 12/2009 | Rajpara et al. | 429/91 |
| 2010/0121587 A1* | 5/2010 | Vian et al. | 702/63 |

OTHER PUBLICATIONS

Keller "Aircraft Electrical Power Systems Prognostics and Health Management", IEEEAC paper #1380, Version 1, (updated version) 2006, pp. 1-9.*
Heckerman "A Tutorial on Learning With Bayesian Networks", MSR-TR-95-06, number of pp. 58.*
Skaanning et al. "Printer Troubleshooting Using Bayesian Networks", R. Loganantharaj et al. (Eds.): IEA/AIE 2000, LNAI 1821, pp. 367-380, Springer-Verlag Berlin Heidelberg 2000.*
Heckerman et al. "Decision-Theoretical Troubleshooting", COMM. ACM, vol. 38, No. 3, pp. 49-57.*
Tenno et al. "Charge-discharge behaviour of VRLA batteries: model calibration and application for state estimation and failure detection", Journal of Power Sources 103 (2001) pp. 42-53.*
Feng Zhao, Xenofon Koutsoukos, Horst Haussecker, Jim Reich, and Patrick Cheung, "Monitoring and Fault Diagnosis of Hybrid Systems," IEEE Transactions on Systems, Man and Cybernetics—Part B: Cybernetics, vol. 35, No. 6, Dec. 2005, 1225-1239.
Richard Dearden, Thomas Willeke, Frank Nutter, Reid Simmons, Vandi Verma and Sebastian Thrun, "Real-time Fault Detection and Situational Awareness for Rovers: Report on the Mars Technology Program Task," Proceedings of IEEE Aerospace Conference, Mar. 2004.
Sebastian Thrun, John Langford, and Vandi Verma, "Risk Sensitive Particle Filters," Proceedings of Neural Information Processing Systems (NIPS), Dec. 2001.
A. T. Cemgil, "Strategies for sequential inference in factorial switching state space models," Accepted to ICASSP 2007, Honolulu, Hawaii, 2007.

(Continued)

*Primary Examiner* — Jeffrey A Gaffin
*Assistant Examiner* — Li-Wu Chang
(74) *Attorney, Agent, or Firm* — O'Brien Jones PLLC

(57) ABSTRACT

A system for monitoring and predicting the condition of an electronic system comprises a component model, an inference engine based on the component model, and an action selection component that selects an action based on an output of the inference engine.

22 Claims, 5 Drawing Sheets

OTHER PUBLICATIONS

A. Willsky, "A survey of design methods for failure detection in dynamic systems," Automatica, vol. 12, pp. 601-610, 1976.

D. Koller and U. Lerner, "Sampling in factored dynamic systems," in Sequential Monte Carlo Methods in Practice, ser. Statistics for Engineering and Information Science. New York: Springer, 2001, pp. 470-488.

M. Hofbaur and B. Williams, "Mode estimation of probabilistic hybrid systems," in Hybrid Systems: Computation and Control (HSCC'02), 2002, pp. 253-266.

R. Morales-Menendez, N. de Freitas, and D. Poole. "Real-time monitoring of complex industrial processes with particle filters," Advances in Neural Information Processing Systems (NIPS), 2002.

N. Muscettola, P. Nayak, B. Pell, and B. Williams. "Remote agent: To boldly go where no AI system has gone before," Artificial Intelligence, 103(1-2), Aug. 1998.

Nicholas Roy and Caleb Earnest. "Dynamic Action Spaces for Information Gain Maximization in Search and Exploration," Proceedings of the American Control Conference (ACC 2006). Minneapolis, Jun. 2006.

N. Roy, G. Gordon and S. Thrun. "Finding Approximate POMDP solutions Through Belief Compression," Journal of Artificial Intelligence Research, 23: 1-39, 2005.

M. Montemerlo, N. Roy and and S. Thrun. "Perspectives on Standardization in Mobile Robot Programming: The Carnegie Mellon Navigation (CARMEN) Toolkit," Proceedings of the IEEE/RSJ International Conference on Intelligent Robots and Systems (IROS 2003). Las Vegas, Oct. 2003. vol. 3, pp. 2436-2441.

R. Neal. "Markov Chain Sampling Methods for Dirichlet Process Mixture Models," Journal of Computational and Graphical Statistics, 2000.

Doucet et al. "Rao-Blackwellised Particle Filtering for Dynamic Bayesian Networks," Appears in Sequential Monte Carlo Methods in Practice A. Doucet, N. de Freitas and N.J. Gordon (eds), Springer-Verlag, 2001.

Doucet et al., On Sequential Monte Carlo Sampling Methods for Bayesian Filtering, Signal Processing Group, Dept. of Engineering, Univ. of Cambridge.

Fong et al., Sequential Monte Carlo Simulation of Dynamical Models with Slowly Varying Parameters: An Extension, Signal Processing Group, Univ. of Cambridge.

Liu et al., Sequential Monte Carlo Methods for Dynamic Systems.

Dempster, A., N. Laird, and D. Rubin, "Maximum likelihood from incomplete data via the EM algorithm," *Journal of the Royal Statistical Society*, 39(1):1-38, 1977.

S. McIlraith, G. Biswas, D. Clancy, and V. Gupta, "Hybrid systems diagnosis," in Hybrid Systems: Computation and Control. ser. Lecture Notes in Computer Science, N. Lynch and B. Krogh, Eds. Springer, 2000, vol. 1790, pp. 282-295.

X. Koutsoukos et al., Estimation of Distributed Hybrid Systems Using Particle Filtering Methods, Dept. of Electrical Engineering and Computer Science, Vanderbilt University.

D. Cox and R. Perez-Kite, "Battery state of health monitoring, combining conductance technology with other measurement parameters for real-time battery performance analysis," Telecommunications Energy Conference, 2000. INTELEC. Twenty-second International, p. 342-347.

Yamauchi, Brian. "All-Weather Perception for Small Autonomous UGVs". In Proceedings of SPIE Defense and Security Conference, Orlando, FL, Mar. 2008.

Lenser, Scott et al., "Practical problems in sliding scale autonomy: A case study". In Proceedings of SPIE Defense and Security Conference, Orlando, FL, Mar. 2008.

Cheung, Carol et al., "UAV-UGV Collaboration with a PackBot UGV and Raven SUAV for Pursuit and Tracking of a Dynamic Target". In Proceedings of SPIE Defense and Security Conference, Orlando, FL, Mar. 2008.

Schoenfeld, Erik et al., "Door Breaching Robotic Manipulator". In Proceedings of SPIE Defense and Security Conference, Orlando, FL, Mar. 2008.

Yamauchi, Brian. "Daredevil: Ultra Wideband Radar Sensing for Small UGVs", In Proceedings of SPIE: Unmanned Systems Technology IX, Orlando, FL, Apr. 2007.

Rudakevych, Pavlo et al., "Integration of the Fido Explosives Detector onto the PackBot EOD UGV", In Proceedings of SPIE vol. 6561, Mar. 2007.

Rudakevych, Pavlo et al., "A man portable hybrid UAV/UGV system", In Proceedings of SPIE vol. 6561, Mar. 2007.

Jones, Chris et al., "Sentinel: An Operator Interface for the Control of Multiple Semi-Autonomous UGVs", In Proceedings of the Association for Unmanned Vehicles Systems International. Orlando, FL, Aug. 2006.

Yamauchi, Brian. "Autonomous Urban Reconnaissance Using Man-Portable UGVs", In Proceedings of SPIE: Unmanned Ground Vehicle Technology VIII, Orlando, FL, Apr. 2006.

Yamauchi, Brian. "Wayfarer: An Autonomous Navigation Payload for the PackBot", In Proceedings of AUVSI Unmanned Vehicles North America 2005, Baltimore, MD, Jun. 2005.

Barnes, Mitch et al., "ThrowBot: Design Considerations for a Man-Portable Throwable Robot", In Proceedings of SPIE vol. 5804, Mar. 2005.

Rudakevych, Pavlo et al., "PackBot EOD Firing System", In Proceedings of SPIE vol. 5804, Mar. 2005.

Yamauchi, Brian. "The Wayfarer Modular Navigation Payload for Intelligent Robot Infrastructure", In Proceedings of SPIE vol. 5804: Unmanned Ground Technology VII, Orlando, FL, Mar. 2005.

Yamauchi, Brian et al., "Griffon: a man-portable hybrid UGV/UAV", In Industrial Robot: An International Journal, vol. 31 No. 5, 2004.

Yamauchi, Brian. "PackBot: A Versatile Platform for Military Robotics", In Proceedings of SPIE vol. 5422: Unmanned Ground Vehicle Technology VI, Orlando, FL, Apr. 2004.

Sword, Lee et al., "Mobility Enhancements for Ballistically Deployed Sensors", In Proceedings of SPIE vol. 4393, Apr. 2001.

Rudakevych, Pavlo. "Wave Control: A Method of Distributed Control for Repeated Unit Tentacles", In Proceedings of SPIE vol. 3839, Aug. 1999.

Rudakevych, Pavlo et al., "Micro Unattended Mobility System (MUMS)", In Proceedings of SPIE vol. 3713, Jul. 1998.

\* cited by examiner

| |
|---|
| SYSTEM VOLTAGE (3.3V) |
| SYSTEM VOLTAGE (5V) |
| VOLTAGE FROM BATTERY (24V-Vsys) |
| CURRENT FROM BATTERY |
| BOOSTER VOLTAGE |
| POWER BOARD LEFT TEMPERATURE |
| POWER BOARD RIGHT TEMPERATURE |
| BATTERY TEMPERATURE |
| BATTERY REMAINING CHARGE (Am) |
| BATTERY CURRENT |
| BATTERY CHARGE REMAINING |
| BATTERY TEMPERATURE |
| TOTAL NUMBER OF CHARGE CYCLES SINCE MANUFACTURE |
| BATTERY TIME OF 15 MOST RECENT CHARGE PEAKS |
| BATTERY VOLTAGE AT 15 MOST RECENT CHARGE PEAKS |
| BATTERY CURRENT AT 15 MOST RECENT CHARGE PEAKS |
| DEPTH (AH) OF 15 MOST RECENT CHARGE CYCLES |

FIG. 2

ELECTRONIC SYSTEM CONDITION MONITORING AND PROGNOSTICS

This application claims priority to U.S. Provisional Patent Application Ser. No. 60/895,752 filed Mar. 20, 2007 and U.S. Provisional Patent Application Ser. No. 61/022,785 filed Jan. 22, 2008. The entire content of both applications are incorporated herein in their entirety.

This invention was made with Government support under contract no. W911NF-07-C-0063, awarded by the U.S. Army Research, Development and Engineering Command (RDECOM) Acquisition Center. The Government has certain rights in the invention.

FIELD

The present teachings relate to modeling, predicting, and mitigating failure of electrical systems, for example in power systems of remote vehicles such as mobile robots.

BACKGROUND

As new technology is integrated into day-to-day operations, the problem of system failure can become more acute. If a complex system fails, the cost to diagnose and fix the problem can dramatically reduce the system's value. While every system strives to be robust and reliable, failure rates for electro-mechanical systems will never reach zero. Instead, failure risk can be more effectively mitigated by engineering systems that can predict and diagnose their own failures, allowing users to take mitigating action before the system becomes unusable. This will allow users to integrate new technology with confidence that it will work when they need it.

Naïve self-diagnosing technology is all around us already: operating systems tell the user that they have "encountered" an error, cellular phones estimate signal strength with "bars," and GPS navigation units tell the user that they have "lost satellite reception." However, these diagnoses are typically opaque and late: the user only learns of the failure after it has occurred and must figure out for himself what mitigating action to take. While this may be acceptable for cell phones and laptops, a more predictive system with better diagnosis can be desirable or even necessary.

SUMMARY OF THE INVENTION

In accordance with certain embodiments of the present teachings, a system for monitoring and predicting the condition of an electronic system comprises a component model, an inference engine based on the component model, and an action selection component that selects an action based on an output of the inference engine.

In addition, a method for monitoring and predicting the condition of an electronic system comprises constructing a component model, predicting a state and a likelihood of failure of the electronic system using an inference engine based on the component model, and mitigating potential failures of the electronic system based on predictions from the inference engine using an engine action selection component that selects an action based on an output of the inference engine.

Further, a method for monitoring and predicting the condition of an electronic system comprises constructing a component model, predicting a state and a likelihood of failure of the electronic system using an inference engine based on the component model, and creating new data to improve prediction accuracy of the inference engine based on predictions from the inference engine.

In addition, a method for informing a user regarding the condition of an electronic system comprises constructing a component model, predicting a state and a likelihood of failure of the electronic system using an inference engine based on the component model and sensor data from the electronic system, and displaying an identification of the electronic system, a predicted state of the electronic system, and a predicted likelihood of failure of the electronic system.

Additional objects and advantages of the invention will be set forth in part in the description which follows, and in part will be obvious from the description, or may be learned by practice of the invention. The objects and advantages of the invention will be realized and attained by means of the elements and combinations particularly pointed out in the appended claims.

It is to be understood that both the foregoing general description and the following detailed description are exemplary and explanatory only and are not restrictive of the invention, as claimed.

The accompanying drawings, which are incorporated in and constitute a part of this specification, illustrate one (several) embodiment(s) of the invention and together with the description, serve to explain the principles of the invention.

BRIEF DESCRIPTION OF THE DRAWINGS

FIG. 2 is a list of sensors that may be available for providing data to an exemplary implementation of a system in accordance with the present teachings.

DESCRIPTION OF EXEMPLARY EMBODIMENTS

Figure 1:
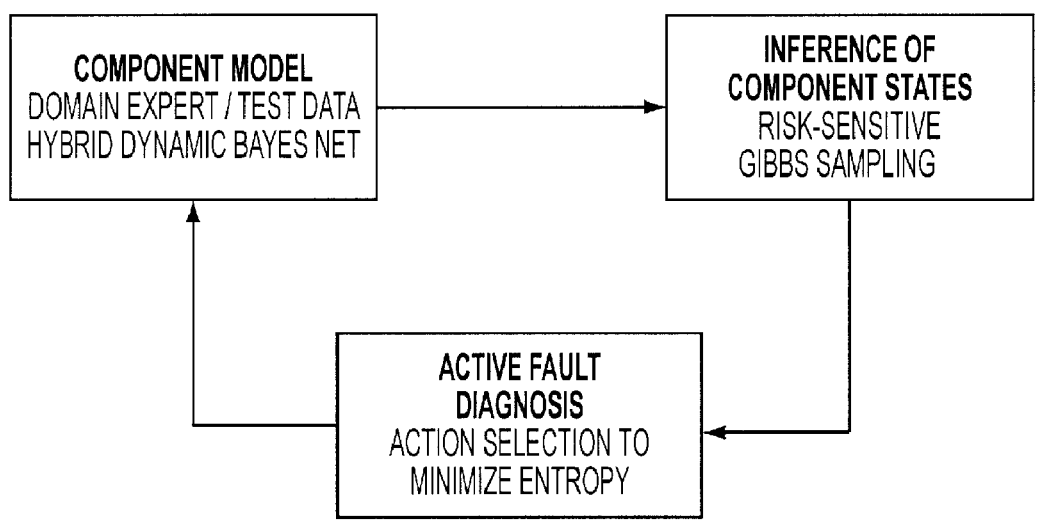
FIG. 1 is a diagram of an exemplary embodiment of a system in accordance with the present teachings.

Reference will now be made in detail to exemplary embodiments of the invention, examples of which are illustrated in the accompanying drawings.

Complex systems, including complex electromechanical systems can fail. Instead of investing endless energy and resources into making systems perfectly robust, failures can be mitigated by modeling the system and predicting failures. The present teachings contemplate a system that takes knowledge from domain experts as well as observed data and creates a model-based inference system for predicting failure in such systems.

In certain exemplary embodiments of the present teachings, a platform for the system can include a power system for a remote vehicle such as, for example, a battery for an iRobot PackBot® EOD Tactical Mobile Robot. Analysis of PackBot® failure data suggests that the power system is the most common failure point, and that those failures can strand the robot in undesirable positions. A system in accordance with the present teachings can help reduce or eliminate these failures by predicting when the power system is near failure, allowing users to replace either the power system or the remote vehicle, as appropriate.

In certain embodiments, the present teachings include a system consisting of three parts: a model, an inference engine, and an action selection component. The model can be constructed using knowledge of key power system elements, like battery chemistry and charging algorithm, and can encode both the nominal operation of the power system and common failure modes. The inference engine can utilize this model and real-time sensor data from a platform such as a remote vehicle to make predictions about the state of the power system and the likelihood of failure. The action selection component can take steps to either mitigate potential failures (based on predictions from the inference engine) or create new data to improve prediction accuracy.

After collecting data about the power system on the subject platform and building a model of one or more electronic system failures, the inference engine can be created.

The present teachings contemplate a system for monitoring and predicting failure in electronic systems. By building a data-driven model of the target system, real-time performance data can be monitored by an inference engine that provides estimates of failure probabilities. This information helps users in two ways. First, if the system itself can use the predictive data to take mitigating action, some failures can be averted without any intervention by the user, reducing overall system downtime and simplifying user operation. In the second circumstance, where there is no mitigating action available or taken internally, the system can expose the predicted failure information, allowing the user to take appropriate action prior to deployment or failure of the system.

Analysis of field data from, for example, PackBot® EODs suggests that power system failures are responsible for a significant portion of overall system failures. Power systems such as on-board batteries currently have naïve self-diagnosis technology in the form of a simple state-of-charge (SoC) indicator. An SoC indicator typically is supposed to provide an estimate of remaining battery life. However, this indicator is not totally reliable, which can result in unit failure mid-mission. Monitoring the battery's state and using that data to generate reliable prognostic data can improve the reliability of electronic systems.

An electronic system condition monitoring and prognostic system in accordance with the present teachings can improve reliability of electrical systems by generating predictions about failures. As stated above, certain embodiments of the system can consist of three parts, which are illustrated in the exemplary embodiment of FIG. 1: a model of the system under observation; an inference engine that reasons about the model; and an active fault diagnosis system that is capable of manipulating the real system to either mitigate failure or improve prediction.

In accordance with various embodiments of the present teachings, the model can be a dynamic Bayesian network. A Bayesian network is a probabilistic graphical model that represents a set of variable and their probabilistic independencies. Formally, Bayesian networks are directed acyclic graphs whose nodes represent variables, and whose arcs encode conditional independencies between the variables. Nodes can represent any kind of variable, such as a measured parameter, a latent variable or a hypothesis. Nodes are not restricted to representing random variables. Efficient algorithms exist that can perform inference and learning in Bayesian networks. Dynamic Bayesian networks (DBNs) model sequences of variables.

In certain embodiments of the present teachings, the nodes in the DBN can represent beliefs about the state of the system's basic components. Some of these states can be observable (such as battery voltage, current draw, etc.), and others can be unobservable. Some of the unobservable states can correspond to beliefs about potential failures of the system. For example, the transitions between the states represent the changes to a remote vehicle over time: voltage drops slightly and current draw increases when the remote vehicle is driving, and this change in state may have some probability of creating failure in a battery of the remote vehicle.

The inference engine can use the model and a stream of incoming data to create an estimate of unobservable states. Several challenges can make the generation of accurate estimates difficult. The model can be very complex, and reasoning about it should be done efficiently and in real-time. There can be failures that are unanticipated and therefore not in the model, but should nevertheless be considered. Moreover, failures can have a very low likelihood and therefore can be difficult to predict.

Finally, the active fault diagnosis system can use the output of the inference engine to either mitigate the failure or refine a belief. If the inference engine suggests a failure type that can be relieved via actions that are entirely internal to the system, those actions can be taken, and further inferences made. In other circumstances, a belief may be too uncertain to act upon, but performing a test can disambiguate an outcome. Certain embodiments of the present teachings contemplate performing this kind of active sensing such that failure predictions exposed to the user are truly a call for user intervention.

The present teachings contemplate anticipating/predicting failure of electrical systems due to, for example, defects or misuse, and allowing the electrical system or its platform to take action on the basis of such predictions. The system of the present teachings can be a part of the platform system itself. In the case of, for example, iRobot PackBot® batteries, there are charging and discharging behaviors that can improve battery life and capacity. In these cases, a remote vehicle can use the predictions of the present teachings to take actions to avoid failures without any intervention from the user, for example by performing such charging and discharging behaviors.

To determine whether failure prediction is possible, the present teachings contemplate determining what type of sensor data can provide information with respect to failure of the target electrical system, and whether there are new, different, or additional sensors that can provide better predictive information. To this end, the present teachings contemplate determining the type of sensor data that domain experts believe will aid in accurately predicting failure, and whether such sensors are available or can be added to the system. Collection methods for generating new data can also be determined, along with a consideration of how well currently-available diagnostic tools for the electronic system perform.

In an exemplary embodiment monitoring a PackBot® battery, the battery may comprise, for example, nickel-cadmium (NiCd) cells at 24V. Such batteries are typically six pounds, and the actual voltage can range from 28V to 31V, with 29V to 31V occurring when the battery is being charged. The expected capacity is 115 WHr, although that capacity is expected to decrease over time. NiCd batteries typically include a basic SoC technology that monitors the voltage of the battery and provides the user with a visual estimate of how much energy is available such as shown in FIG. 5A.

Data from the target electrical system can be collected and analyzed according to the present teachings, and domain experts can be consulted to ensure that desirable or necessary sensor data is available for accurate prediction of certain failure modes. Empirical data can be gathered from lab tests and field tests.

In certain embodiments of the present teachings, data about the battery and power system of a PackBot® can be made available, for example, from an extensive suite of existing sensors, as listed in FIG. 2. As can be seen, in such an embodiment, 17 sensors can report data about the state of the power system, and can therefore serve as at least a starting point for data analysis of the battery. The sensors can provide data about, for example, electrical (voltage, current), environmental (temperature), and historical (charge cycles) aspects of PackBot® power operation.

In accordance with the present teachings, an appropriate amount of sensor data history can be used to make accurate predictions. For example, a current sensor suite can provide information about the last 15 charge cycles, which may be suitable for accurate predictions.

In embodiments where this data may not provide suitably accurate failure prediction, the present teachings contemplate providing alternative battery and power system sensors that provide data useful for battery life prediction. One sensor, for example, that may provide data having a high correlation with battery health measures internal battery impedance.

In accordance with various embodiments of the present teachings, a source for battery data can include the results of battery validation tests. Typically, when each battery is received, it is given a full charge-discharge cycle to ensure basic functionality. Aggregating and examining these curves can provide data including an ample sense of what charge-discharge curves look like under controlled conditions. Variations from battery to battery can also be demonstrated. While validation test data typically does not inform the system about what battery failures look like (unless the test identifies a failed battery), it can provide data regarding typical battery behavior.

However, battery data from validation tests can differ significantly from battery data from actual use because battery validation procedures discharge the battery at a fixed current, while discharge from typical behavior can be more uneven. Changes in discharge pattern can impact the battery. Certain embodiments of the present teachings contemplate evaluating the differences between validation charge/discharge profiles and real use charge/discharge profiles to create an alternative validation procedure to generate more accurate data for model construction.

Certain embodiments of the present teachings contemplate evaluating the amount of data that is required to create a model that supports accurate prediction, allowing data-gathering requirements to be minimized. Minimizing data gathering requirements can be balanced against the need to allow the model to generalize to other electrical systems.

Certain exemplary embodiments of the present teachings contemplate utilizing data from one or both of two state-of-the-art techniques for analyzing batteries: a "three point test" (see Buchmann, *Batteries in a Portable World*, Cadex Electronics Inc, 2d Edition (May 2001), the entire content of which is incorporated herein by reference), and a commercially-available Cadex C7400 Battery Analyzer. These techniques typically cannot predict failures, but rather provide an estimate regarding a battery's State of Health (SoH). However, as current, proven technologies, they can provide useful benchmarks for the performance of systems in accordance with the present teachings.

Three point testing measures the battery's impedance, voltage during charge, and voltage during discharge. These three values are compared to the values for known good batteries to develop an estimate of the remaining capacity. This method can require the battery to be more than 50 percent charged at the time of testing, can be inaccurate for NiCd batteries, and can overestimate the charge of some batteries.

The Cadex C7400 uses more sophisticated analyses and is reported to be more effective. It trains a neural network on a number of known good batteries and evaluates subsequent batteries using that network. While this system can be effective for determining a battery's SoH, it has several shortcomings. First, it only diagnoses the current state of a battery—it does not predict how a battery's capacity will change in the future and does not provide an estimate for likelihood of failure. Second, it does not account for the details of how a battery was charged and discharged, limiting its ability to accurately detect non-standard battery failure modes. Third, the Cadex system is targeted only at power systems. Finally, the tester is external to the electronic system and requires cumbersome hardware to perform the test. The present teachings contemplate various embodiments that are both integral with and external to an electronic system being monitored and provide real-time updates to the full electronic system.

Component Modeling

After data collection is complete, a component model (see FIG. 1) is constructed from the data. The component model encodes known data about the batteries, correlating sensor data with beliefs about the state of the system. Next, one or more failure modes can be modeled and incorporated, for example, into a dynamic Bayesian network (DBN) model.

To effectively predict power system failures, the present teachings contemplate incorporating at least one common failure mode, a few examples of which are set forth below.

Manufacturing differences and defects: Batteries typically comprise several cells, and the precise quality and matching of those cells is critical to both short-term and long-term battery performance. Cell differences become apparent during battery qualification and testing. Various embodiments of the present teachings factor these battery-to-battery differences into predictions about when the battery needs to be replaced.

Long-term organic loss of capacity: Over time, all batteries lose some capacity due to the deterioration of the physical materials in the cells. This loss occurs gradually over the life of the battery, and cannot be reversed, although use of proper charging behaviors can delay its onset. When the battery's capacity has become to low to be useful, the battery should be replaced.

"Memory effects": Nickel-cadmium battery chemistries lose charge capacity over time if there is failure to exercise (fully charge and discharge) the battery periodically. This loss in charge capacity can cause the battery to appear fully charged when, in fact, its behavior will more closely mirror that of a much smaller capacity battery. Sometimes, this effect can be reversed by fully discharging the battery, then charging it at a very slow rate. Otherwise, the battery should be replaced.

Damage from improper charging: Even though the NiCd chemistry can be relatively resistant to abuse from improper charging behaviors and algorithms, overcharging the battery can cause damage. A common damaged-battery behavior is "venting" (the battery leaks some of its electrolyte). This can reduce the charge capacity very quickly and is an indicator that the battery should be replaced.

A model of an electronic system such as a power system (e.g., a battery) can include the phenomena most directly related to system failures, specifically the capacity of the battery and the expected remaining charge. Battery health can be modeled as hidden variables that can be estimated from observable quantities such as battery voltage, battery current consumed, battery temperature, etc. These observable quantities may be noisy predictors of the battery health, but probabilistic inference can be used to compute the most likely state of the battery.

Certain embodiments of the present teachings contemplate decomposing the modeling problem into two sub-problems at different time scales. (1) Over long time scales, modeling a true health of the battery and its failure mode as hidden variables that must be reconstructed from observable quantities such as battery voltage, consumed battery current, battery temperature, etc. (2) Over relatively short time scales, charging dynamics of the battery can be modeled and correlated with changes in battery capacity. In effect, a predictor of the current battery capacity is developed that provides important evidence for how a battery's health will degrade under future operating conditions.

Modeling Over Long Time Scales

If battery capacity after n charge/discharge cycles is written as $c_n$, the output voltage as $v_n$, and the total current consumed as $i_n$, then a probabilistic model of battery performance can be developed, $p(c_n|v_n, i_n)$, from past statistics of the battery. In practice, it may be easier to learn a generative model of the observations $p(v_n, i_n|c_n)$ and then use Bayes' rule to predict the present battery capacity from those observed quantities.

In all real problems of practical significance, building an optimal model based on Bayes' rule is intractable, and some structure must be introduced into the model. This structure typically takes the form of conditional independence assumptions about the relationships among observable quantities. For instance, if it is assumed that battery voltage and current are independent given capacity, then battery capacity can be predicted using Bayes' rule and "smaller" models of $p(i_n|c_n)$ and $p(v_n|c_n)$ individually. Since a battery is a voltage source that varies the current with the load, this independence assumption will only be true up to a point. The point at which this independence assumption fails is one example of a predicted failure mode.

Models of conditional independence can be depicted as a graph, where nodes represent random variables and arcs represent dependencies between two variables. A dynamic Bayesian network (DBN) is one such graphical model that may be particularly suited to a system in accordance with the present teachings because DBNs explicitly model dependencies over time. For a system in accordance with the present teachings, the nodes in a DBN can represent beliefs about the state of the system's basic components. Some of these states will be observable (such as battery voltage, current draw, etc.), others will be unobservable. Some of the unobservable states can correspond to beliefs about potential failures of the system. The transitions between the states can represent the changes to the robot over time.

An inference engine in accordance with the present teachings can use the component model and a stream of incoming data to create an estimate of the unobservable states. Several challenges make the generation of accurate estimates difficult. The full model (even with simplifying conditional independence assumptions) can be very complex, and reasoning about it must be done efficiently and in real-time.

Modeling Over Short Time Scales

During each charge/discharge cycle, the observable quantities (battery voltage, current and temperature) exhibit characteristic patterns that depend on how the battery is exercised. For example, if a battery is discharged quickly (i.e., with high current draw) then, not surprisingly, battery temperature tends to increase quickly as well. But if external battery operating conditions are controlled, then the observed, characteristic patterns depend largely on the internal dynamics of the battery. This can lead to four main assumptions for models over short time scales:

1. The underlying dynamics of a battery can be modeled as a system of smooth differential equations (or smooth difference equations in the case of a discrete-time model). A smooth model, i.e., a continuous function with a continuous derivative, is the key requirement for Takens' Theorem (see F. Takens, "Detecting strange attractors in turbulence," *Lecture Notes in Mathematics*, 898:366-381, 1981, the entire content of which is incorporated by reference herein) which provides a theoretical basis for reconstructing certain properties of a multi-dimensional, nonlinear dynamic system by measuring a single observable quantity over time.

2. Battery health is closely related to battery dynamics during charging. Intuitively, a change in battery capacity is associated with a change in the chemical and physical "rules" that govern the way charge flows into the battery. Certain embodiments of the present teachings can focus on charging because the charging algorithm can be controlled, whereas the discharging pattern can vary greatly depending on how a platform electronic system powered by the battery is used.

3. The dynamics are fixed during each charging phase. The health of the battery can be expected to deteriorate over time, but those time scales are assumed to be much longer than a single charging phase.

4. Cycle-to-cycle comparisons of dynamics during charging use the same charging algorithm. This ensures that observed changes in dynamics are due primarily to changes in the battery health, rather than external effects. Different charging algorithms can be used during the life of the battery, as long as the data are partitioned accordingly for any subsequent analysis. Other external effects (e.g., ambient temperature) are modeled as noise.

The above modeling over short and long time scales predicts the present health of the battery, rather than future health over the lifetime of the battery. For future health prediction, one must account for both charging and discharging patterns over numerous cycles, and a complementary DBN approach can be more suitable as discussed generally above and in more detail below.

The first step in building a model of charging dynamics is to reconstruct hidden state information from the observable quantities. Using a delay embedded theorem such as Takens' theorem, reconstructing hidden state information can be performed using a temperature time series alone. A reconstructed state can, for example, include just two quantities at each time step: temperature and rate of change in temperature, although a variety of quantities are contemplated.

The next step is to build a model that describes how the state changes over time. In various embodiments of the present teachings, a class of differential equations is devised that are suitable for battery charging and then available data is used to fit the coefficients of the equations. However, given the variability in battery operating conditions, a class of models that directly accounts for uncertainly may be more suitable. One such class is first-order Markov models, where the dynamics are represented as the probability of transitioning between two of a finite number of states.

To build a Markov model for the results presented below, temperature can be discretized using five intervals (very low, low, medium, high, very high) and rate of change in temperature using three intervals (negative, near zero, positive). In this way, a two-dimensional, real-valued state space can be converted into a discrete state set of size 15. A state transition matrix, A, can then be built where each entry, $a_{ij}$, is the probability of transitioning from state i to state j. To estimate each $a_{ij}$, the number of observed transitions from state i to state j can be counted and normalized by the total number of counts associated with each row of A. One advantageous aspect of a Markov model is that the probability that a particular model generated an observed data set can be computed.

Figure 4:
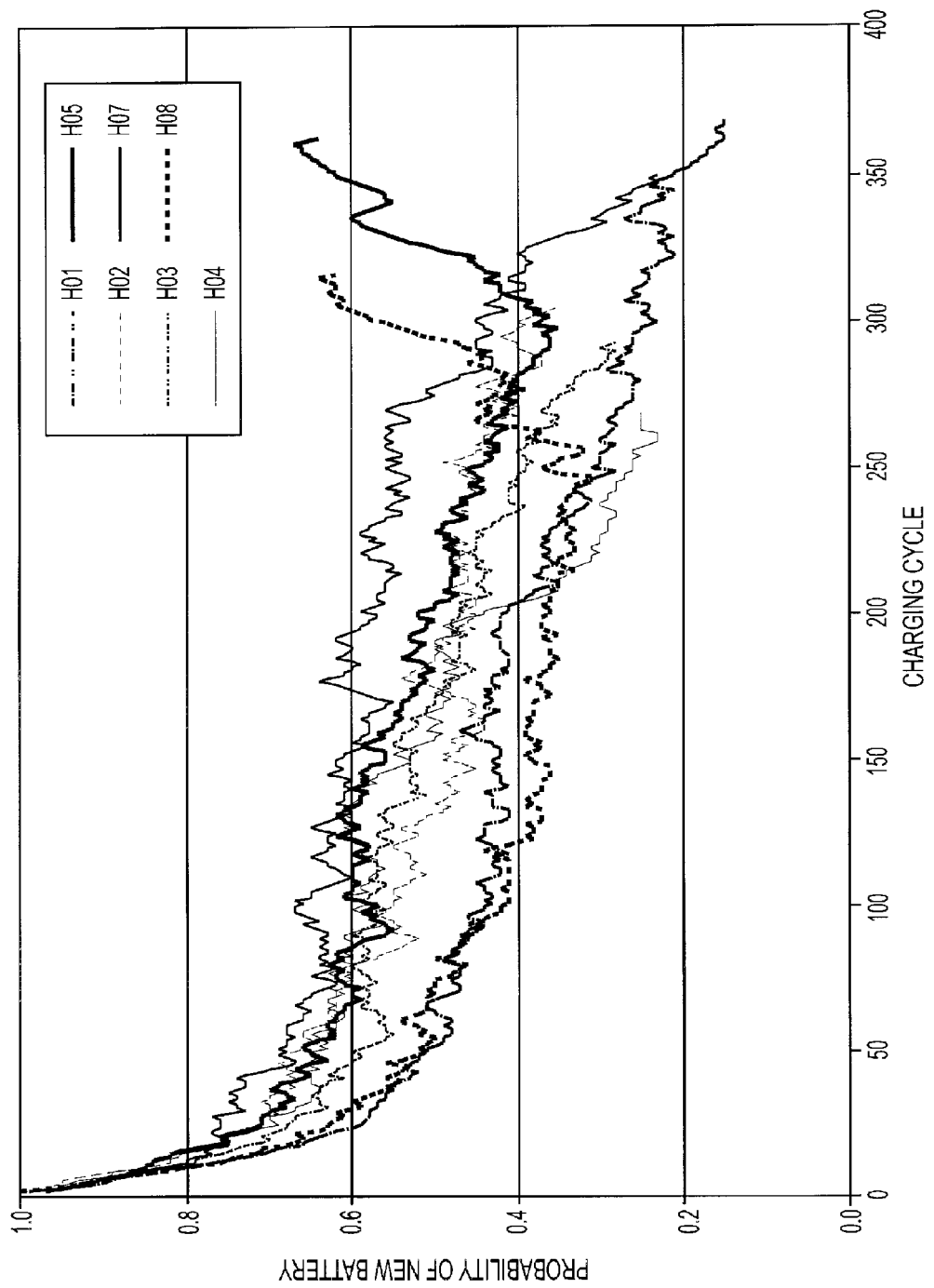
FIG. 4 is a graph showing predicted battery health for a number of NiCd batteries using modeled dynamics based solely on charging temperature.

FIG. 4 is a graph showing how modeled dynamics can be predictive of battery health. In particular, the graph shows the estimated probability that a battery is new, based solely on the charging temperature. Notice the roughly linear decrease in value during the life of each battery. This corresponds to a roughly linear decrease in capacity for the same batteries from about 2100 mAh to about 1350 mAh during the same period of time.

Each curve in FIG. 4 corresponds to one of seven batteries. For each battery, the other six batteries were used to build two transition matrices, $A_{early}$ and $A_{late}$, where $A_{early}$ was calculated from the first 100 charging cycles and $A_{late}$ was calculated from cycles 150-250. Then for each "test" battery, $p_{early}$ and $p_{late}$ were computed, the likelihood of the observed temperature data under the two models ($A_{early}$ and $A_{late}$). As an estimate of the probability that the battery is new, $p_{early}$ is used, as normalized by the sum $p_{early}+p_{late}$. For the graph of FIG. 4, the results were lowpass filtered using a single-pole, recursive filter with a coefficient of 0.95 and an initial output of 1.0. Initializing the output to 1.0 inflates the estimated probability during the first 20-30 cycles.

Inference of Component States

One of the ways that naïve predictive models can fail, is to assume that each prediction of battery capacity ct is independent of previous observations, which is not the case. Various embodiments of the present teachings instead contemplate modeling the battery capacity as time series data, assuming a first-order Markov model, in which $c_{t-1}$ is independent of $c_{t+1}$ given $c_t$. This allows writing the dynamics of the system in terms of one-step transition probabilities, $p(c_{t+1}|c_t)$.

Additionally, certain embodiments of the present teachings assume that the observable variables such as voltage $v_t$ and current $i_t$ depend only on the immediate battery capacity. This allows writing the measurement model as one-step observation probabilities, $p(z|c)$ where z is an observable quantity. Z represents the vector of all observations at time t—in the example so far, $Z=(v, i)$.

These independence assumptions do not decouple the inference of the battery capacity from past observations; the history of observations $Z_t$ can still be used in estimating the battery health, that is $p(c_t|Z_t, Z_{t-1}, \ldots, Z_0)$. However, independence assumptions allow integration of new observations recursively, so that $$p(c_t|Z_t, Z_{t-1}, \ldots, Z_0) = p(Z_t|c_{t-1}) \int c_{t-1} p(c_t|c_{t-1}) p(c_{t-1}|Z_{t-1}, \ldots, Z_0) dc_{t-1}$$

Keeping track of the probability distribution at time t as bt, we can see the recursion as the Bayes' filter $$b_t(c) = p(Z_t|c) \int c' p(c|c') b_{t-1}(c') dc'$$

where again $p(Z|c)$ is the observation probability model (learned from past data) and $p(c|c')$ is the dynamic model of the battery (also learned from past data).

In order to estimate the battery state, a specific form of probability distribution can be chosen for $p(c)$; for discrete states, a common representation is to use a multinomial that assigns a separate probability to each possible state. For continuous states such as battery capacities, a common representation is to use a Gaussian model. When the system dynamics are linear and the transition and observation probabilities are Gaussian, the Bayes' filter reduces to the Kalman filter.

In various embodiments for monitoring a battery, a known hybrid DBN model can be constructed using data from domain experts, with model parameters (transition and observation probabilities) collected from power and battery data. However, accurate models will become increasingly difficult to specify as more components and more failure modes are added and the complexity of the model grows. As a result, learning algorithms can allow the entire system to reason both about the model itself and specific failures in the model.

A number of Bayesian network learning algorithms exist, including a common learning algorithm known as Expectation Maximization (EM). An EM algorithm can be used in statistics for finding maximum likelihood estimates of parameters in probabilistic models, where the model depends on unobserved latent variables. EM alternates between performing an expectation (E) step, which computes an expectation of the likelihood by including the latent variables as if they were observed, and a maximization (M) step, which computes the maximum likelihood estimates of the parameters by maximizing the expected likelihood found on the E step. The parameters found on the M step are then used to begin another E step, and the process is repeated.

EM has been shown to be effective at both learning the Bayesian network structure (i.e., detecting conditional independencies) and also learning the conditional probability tables. The model need not be learned from scratch. In some instances, domain experts can provide an initial estimate of the network structure and the model parameters. EM is most effective when given good initialization conditions, which allows using human-provided Bayesian network models and a set of data about performance of the electronic system and its failure modes to learn more efficiently than from the data alone.

To develop an inference engine, to predict electronic system failure, the encoded knowledge about known failure modes in the DBN models is used to generate inferences about system failure, even, in certain embodiments, estimating failure modes that rarely occur.

The time series models described above allow computation of a probability estimate of electrical system failure given specified model dynamics and observation probabilities. However, the model dynamics and observation probabilities are strongly affected by the underlying health of the electronic system (e.g., a battery). For example, under a constant load, a battery capacity can nominally decrease with some reasonable time constant. However, one of the potential failure modes for NiCd batteries is reduced capacity from the "memory effect," leading to unexpected power losses. The impact of the memory effect is to change the transition dynamics $p(c_t|c_{t-1})$. This can be modeled as either a faster loss in capacity, or a failure to reach full capacity after charging. In either case, accurately tracking (and accurately predicting) battery capacity can require knowledge of which dynamics are governing the battery behavior: the nominal case $p(c_t|c_{t-1})$ or the memory effect case $p_m e(c_t|c_{t-1})$.

A memory effect can be incorporated into the battery state, but may not be directly observable if, for example, the short cycles happened while charging or discharging in a different electronic system, for example a different remote vehicle (e.g., a PackBot®) or because it happened during a cycle that was not recorded in memory. The battery failure mode is estimated to accurately estimate and predict battery performance. The complete battery state can be written as $X=(c, me)$ where c is the capacity as before and me is the mode variable (nominal or under memory effect), and a belief can be computed over a joint of the battery and the mode using the Bayes' filter again:

$$b_t(X) = p(Z_t|X) \int_{X'} p(X'|X) b_{t-1}(X') dX'$$

When the battery state is extended to incorporate both capacity and mode state, the state can be extended to incorporate a number of variables, such as the capacity and failures of individual cells within a single battery, and failure modes other than the memory effect problem. As the number of variables increases, estimating the joint distribution over all variables can become computationally demanding, and collecting enough data to be able to estimate the statistics of all possible transitions between variable states can grow exponentially with the number of variables in the state.

However, structure in the model can be exploited to reduce the complexity of inferring the distribution over X. In particular, many of the variables and their transitions are conditionally independent of one another. For instance, the probability of a battery encountering two different failure modes (e.g., a memory effect state $me_t$ and a failed cell $fc_t$) are likely to be independent. Thus, the transition probability $p(X_t|X_{t-1})$ for X=(c, me, fc) can be written as a product:

$$p(X_t|X_{t-1}) = p(c_t|c_{t-1}, me_{t-1}, fc_{t-1}) \cdot p(me_t|me_{t-1}) \cdot p(fc_t|fc_{t-1})$$

This factored representation corresponds to a DBN model that has been shown to allow tractable inference in very high dimensional problems. Additionally, the compact nature of local transition models (e.g., $p(me_t|me_{t-1})$, also known as conditional probability tables) allows the model parameters to be computed from much less data than a flat model.

Figure 3:
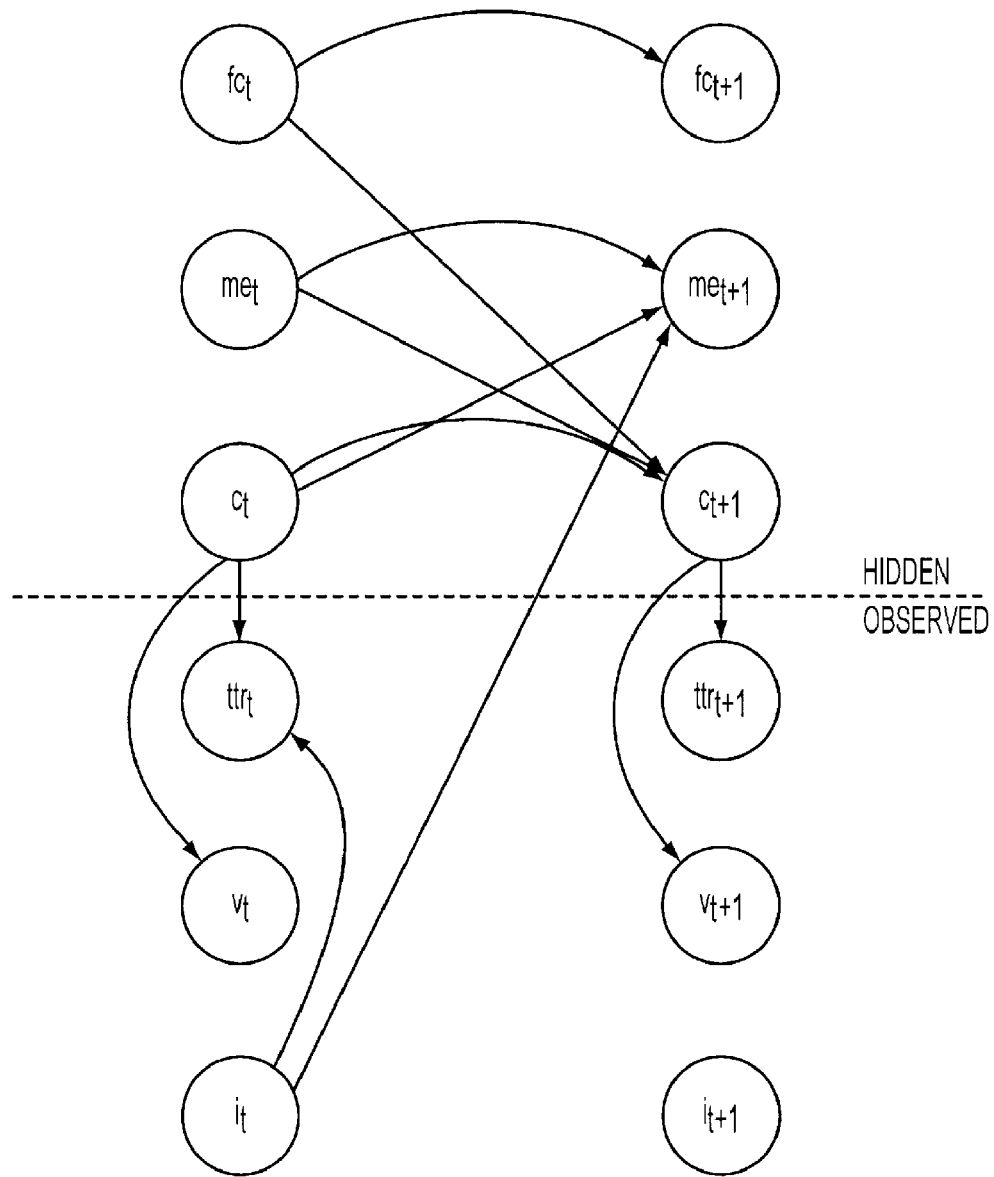
FIG. 3 shows an example dynamic Bayesian network including observable and hidden state variables.

FIG. 3 shows an example DBN that includes the hidden state variables battery capacity $c_t$, memory effect state $me_t$, failed battery cell $fc_t$, and a number of observable features including voltage $v_t$, current $i_t$, and time to next recharge, $ttr_t$. The arrows describe the conditional probability dependencies: the battery voltage depends only on the battery capacity, but the memory effect state on the next time step $me_{t+1}$ depends on the present battery capacity $c_t$, the present battery current it and the present memory effect state $me_t$.

Despite the computational savings produced by the factored model, computing the exact probability distribution of the full state X can still grow exponentially with the number of state variables. The computational cost can be bound by approximating the distribution over X. One exemplary popular approximation includes representing the distribution non-parametrically using Markov Chain Monte Carlo (MCMC) techniques such as the Gibbs sampler. Gibbs sampling is an algorithm to generate a sequence of samples from the joint probability distribution of two or more random variables. The purpose of such a sequence is to approximate the joint distribution, or to compute an integral (such as an expected variable). Non-parametric (particle-based) techniques typically rarely require assumptions of the transition or observation models (such as linearity and normality). They are easily used in both discrete and continuous domains. A good non-parametric estimate will usually preserve an unbiased estimate of moments of the true distribution, and efficient algorithms exist for generating samples from the probability distribution.

Popular sampling strategies such as the Gibbs sampler can allow generation of samples from a full Bayesian network, creating a new sample X[i]~p(X) by sampling a new value for each state variable in turn conditioned on all other state variables. Given a set of n samples X[1], X[2], ..., X[n], an additional sample X[n+1] can be drawn using $$x_i[n+1] \sim p(x_i | x_{j \neq i}[n])$$

In accordance with various embodiments of the present teachings, the specific Bayesian network for which a probability distribution will be computed is a two-step DBN, wherein the distribution is the joint $p(X_{t-1}, X_t)$. However, this structure allows further simplification; at each time step t, only samples of $X_t$ from a current estimate of $p(X_{t-1})$ need to be generated. New samples of $X_{t-1}$ state variables do not need to be generated, rather, samples of $X_t$ from the previous time step can be re-used.

Advantages of MCMC approximation of a particle filter are two-fold: first, the update procedure for computing additional samples is usually no longer exponential in the number of variables (although the number of required samples to compute accurate statistics of the distribution may still be exponentially large); second, MCMC techniques can be made arbitrarily fast by decreasing the quality of the approximation. This is particularly appropriate for inference in domains where the computation may be bounded by CPU limits and real-time response constraints.

Sample complexity (required number of samples) can be reduced in hybrid systems when the continuous variables are modeled as Gaussians; a process known as "Rao-Blackwellization" can be used to integrate the continuous variables out of the probability distribution, sample from the remaining marginal distribution, and represent the integrated variables using an analytic Gaussian solution. This results in a probability distribution expressed as follows:

$$p(X_t) = p(X_t^{(c)} | X_t^{(d)}) p(X_t^{(d)})$$

where $X^{(c)}$ are the continuous state variables expressed as parametric Gaussian distributions and the discrete state variables are expressed as sampled particles. This Rao-Blackwellization process in general provides a more accurate estimate of the probability distribution in situations where some state variables can be estimated analytically conditioned on the sampled values.

The Rao-Blackwell theorem is a result that characterizes the transformation of an arbitrarily crude estimator into an estimator that is optimal by the mean-squared-error criterion or any of a variety of similar criteria. The Rao-Blackwell theorem states that if g(X) is any kind of estimator of a parameter θ, then the conditional expectation of g(X) given T(X), where T is a sufficient statistic, is typically a better estimator of θ, and is never worse.

A potential problem with the MCMC approach to failure diagnosis, however, is that the failure modes tend to be relatively rare events. This rarity will be reflected in low probability transitions of state variables, such as $p(me_t = true | me_{t-1} = false)$. As a result, a large number of samples may be required in order to ensure that sufficient probability mass is placed on potential failure modes, in order to accurately capture their relative likelihood.

This potential problem can be addressed by "encouraging" the sampler to sample directly from failure modes, modifying the probability distribution to include a risk factor that approximates the expected cost of the approximation. In the diagnosis case, the cost of the approximation is the expected error due to a missed diagnosis. As a result, samples can be generated according to $$\gamma_t l(X_t) p(X_t | Z_t)$$

where $\gamma_t = 1 \; sl(x) \; p(x|z_t, y_t) dx \; l^{-1}$ is a normalization constant and l(X) is a risk function. This distribution can be sampled by sampling $X_{t+1}$ according to a set of weighted $X_t$, where the weight for each sample $X_t[j]$ is given as $$w_t[j] = l(X_t[j]) l(x_{t-1}[j])^{-1} p(Z_t | X_t[j]).$$

The risk function l(X) can be computed from costs associated with executing the wrong action in the wrong state if available, or by trading off false positive and false negative detection rates for fixed computational resources.

A secondary issue in the inference procedure is being able to detect failure modes that do not correspond to known failures. For instance, in the DBN shown in FIG. 3, the two failure modes are memory effect and a failed cell within the battery. There is no failure mode variable corresponding to chemical death of a battery that will inevitable occur with use over time. In general, there may be inevitable failure modes that are not captured by the model, and certain embodiments of the present teachings contemplate detecting these failure modes.

The problem of incomplete models is not just an issue for the user who may not be warned of a potential failure, but in particular an unknown failure mode can be an issue for the MCMC inference algorithm. In situations where the observed data is extremely unlikely given any combination of values of the state variables, the risk-sensitive MCMC may experience a phenomenon known as "particle death" where all the particle weights in the equation become vanishingly small. Therefore, the present teachings contemplate providing an additional "unknown" mode variable that redistributes the probability mass evenly across all state variables, independently of the parent variable values. When a failure occurs that cannot be explained by the existing state variables, the risk-sensitive sampler will naturally converge to a set of samples that set the "unknown" failure mode to be true.

Figure 5B:
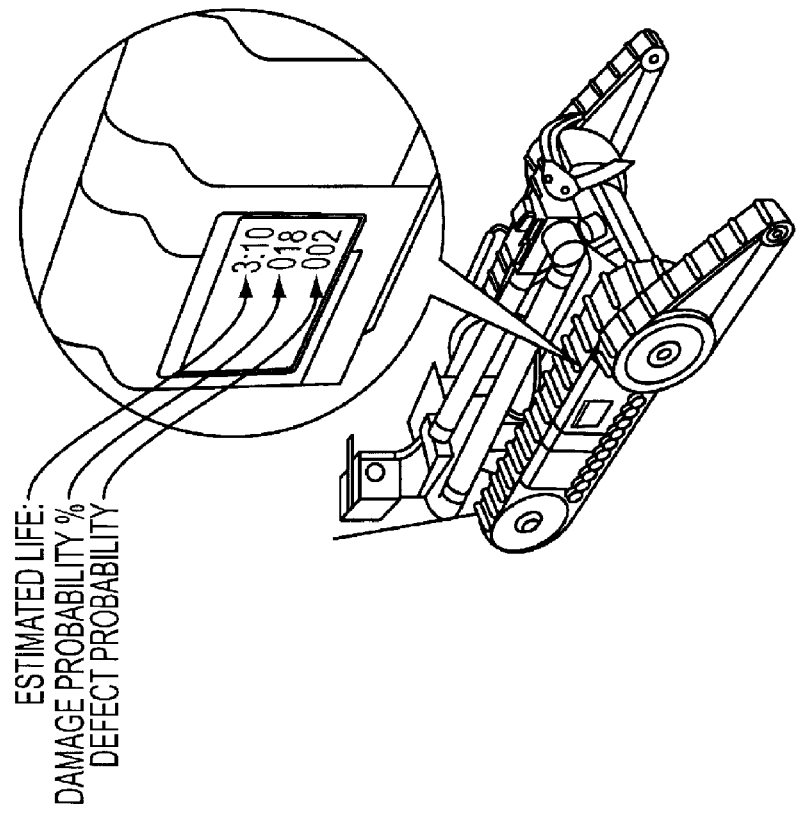
FIG. 5B illustrates a remote vehicle having a display indicating a target electrical system and the predicted condition of various aspects of the target electrical system's condition.
Figure 5A:
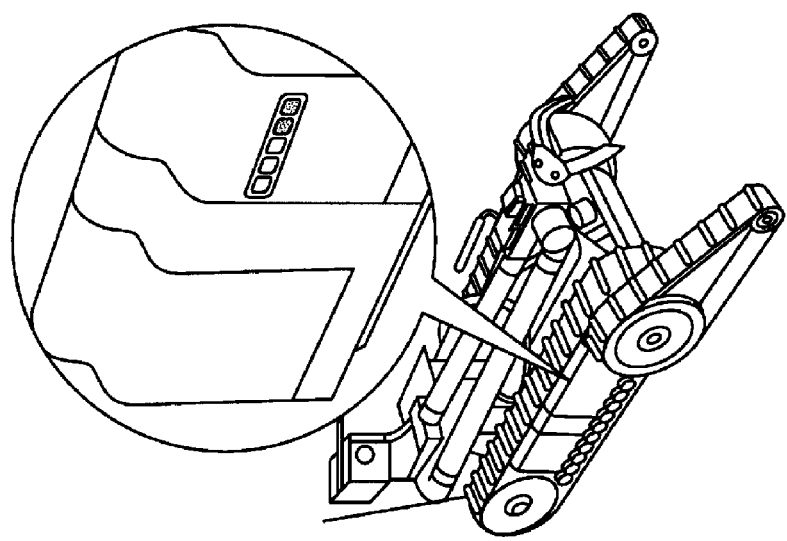
FIG. 5A illustrates a remote vehicle having a known battery charge indicator.

Upon determining the electrical system condition, the electronic system can be identified, and various known or predicted aspects of the electrical system's condition (health) can be displayed, for example, using known display technologies as illustrated in an exemplary display on the FIG. 5B.

Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A system for monitoring and predicting the condition of a power system of a remote vehicle, the system including memory, and comprising:
    a component model residing in the memory and constructed using power system modeling over both short time scales and long time scales, the short time scales being related to a state of charge of the power system and the long time scales being related to a likelihood of failure of the power system;
    an inference engine utilizing the component model and sensor data including at least a temperature of the power system to make predictions about a state of charge of the power system and a likelihood of failure of the power system; and
    an action selection component that selects an action to mitigate a potential failure based on an output of the inference engine.

2. The system of claim 1, wherein the power system is a battery of the remote vehicle.

3. The system of claim 2, wherein the component model is constructed using knowledge of a battery chemistry and a battery charging algorithm.

4. The system of claim 1, wherein the component model includes a dynamic Bayesian network model having current state variables that depend on state variables from previous time steps.

5. The system of claim 1, wherein the action selection component creates new data to improve prediction accuracy of the inference engine.

6. The system of claim 1, wherein the component model encodes known data about the power system, correlating the sensor data with beliefs about the state of charge of the power system.

7. The system of claim 1, wherein the sensor data comprises a stream of incoming data from one or more sensors of the remote vehicle.

8. The system of claim 7, wherein the one or more sensors comprise an internal battery impedance sensor.

9. The system of claim 7, wherein the stream of incoming data comprises a count of the number of power system charge cycles since manufacture.

10. The system of claim 1, wherein the sensor data comprises at least a voltage and a temperature of the power system.

11. The system of claim 10, wherein the inference engine also utilizes a rate of change of temperature of the power system to make predictions about the power system.

12. The system of claim 1, further comprising an active fault diagnosis system that uses an output of the inference engine to mitigate failure of the power system or refine a belief regarding a potential failure of the power system.

13. A method for monitoring and predicting the condition of a power system of a remote vehicle, the method comprising:
    constructing a component model using power system modeling over both short and long time scales, the short time scales being related to a state of charge of the power system and the long time scales being related to a likelihood of failure of the power system;
    predicting, using a processor, a state of charge of the power system and a likelihood of failure of the power system based on the component model and sensor data including at least a temperature of the power system; and
    mitigating predicted potential failures of the power system by selecting an action to mitigate a potential failure.

14. The system of claim 13, wherein the power electronic system is a battery of the remote vehicle.

15. The system of claim 13, wherein the component model includes a dynamic Bayesian network model having current state variables that depend on state variables from previous time steps.

16. The system of claim 13, further comprising creating new data to improve prediction accuracy.

17. A method for monitoring and predicting the condition of a power system of a remote vehicle, the method comprising:
    constructing a component model using power system modeling over both short time scales and long time scales, the short time scales being related to a state of charge of the power system and the long time scales being related to a likelihood of failure of the power system;
    predicting, using a processor, a state of charge of the power system and a likelihood of failure of the power system based on the component model and sensor data including at least a temperature of the power system; and
    creating new data to improve prediction accuracy.

18. The system of claim 17, wherein the power system is a battery of the remote vehicle.

19. The system of claim 17, wherein the component model includes a dynamic Bayesian network model having current state variables that depend on state variables from previous time steps.

20. The method of claim 17, wherein constructing the component model includes modeling and incorporating at least one failure mode into a dynamic Bayesian network model.

21. The method of claim 20, wherein the at least one failure mode comprises one or more of manufacturing differences and defects, long-term organic loss of capacity memory effects, and damage from improper charging.

22. A method for informing a user regarding the condition of a power system of a remote vehicle, the method comprising:

constructing a component model using power system modeling over both short time scales and long time scales, the short time scales being related to a state of charge of the power system and the long time scales being related to a likelihood of failure of the power system;

predicting, using a processor, a state of charge of the power system and a likelihood of failure of the power system based on the component model and sensor data including at least a temperature of the power system; and displaying, to an operator of the remote vehicle, an identification of the power system, a predicted state of the power system, and a predicted likelihood of failure of the power system.

* * * * *